United States Patent
Lauther

(10) Patent No.: US 6,470,065 B1
(45) Date of Patent: Oct. 22, 2002

(54) APPARATUS FOR COMPUTER TOMOGRAPHY SCANNING WITH COMPRESSION OF MEASUREMENT DATA

(75) Inventor: Ulrich Lauther, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/905,753

(22) Filed: Jul. 13, 2001

(51) Int. Cl.$^7$ .................................................. H61B 6/03
(52) U.S. Cl. .......................................... 378/4; 378/901
(58) Field of Search ........................... 378/4, 8, 15, 901

(56) References Cited

U.S. PATENT DOCUMENTS

| | | | |
|---|---|---|---|
| 5,592,523 A | 1/1997 | Tuy et al. | 378/19 |
| 5,825,830 A | * 10/1998 | Kopf | 341/51 |

OTHER PUBLICATIONS

"A Method for the Construction of Minimum–Redundancy Codes," Huffman, Proceedings of the I.R.E., Sep., 1952, pp. 1098–1101.

"Arithmetic Coding for Data Compression," Witten et al., Communications of the ACM, vol. 30, No. 6, Jun., 1987, pp. 520–540.

"LOCO–I: A Low Complexity, Context–Based. Lossless Image Compression Algorithm," Weinberger et al., Proceedings of the IEEE Data Compression Conference, Mar.–Apr., 1996.

"Data Compression with the Burrows–Wheeler Transform," Nelson, Sep., 1996.

"Practical Huffman Coding," Schindler, Compression Consulting, Aug.–Oct., 1998.

* cited by examiner

*Primary Examiner*—David V. Bruce
(74) *Attorney, Agent, or Firm*—Schiff Hardin & Waite

(57) ABSTRACT

A CT scan system with a compressing unit that compresses the data acquired by means of an X-ray source, before the data is being transmitted to a central processing unit. The data compressing unit utilizes an entropy coding method for data compression. Four arrays of sensors are being used in one reading to create the data with a certain periodicity superimposed to the matrix of data that must be taken into account to achieve significant compression improvements. The present invention yields compression rates in the range of 20% to 30% while maintaining fast operation.

12 Claims, 1 Drawing Sheet

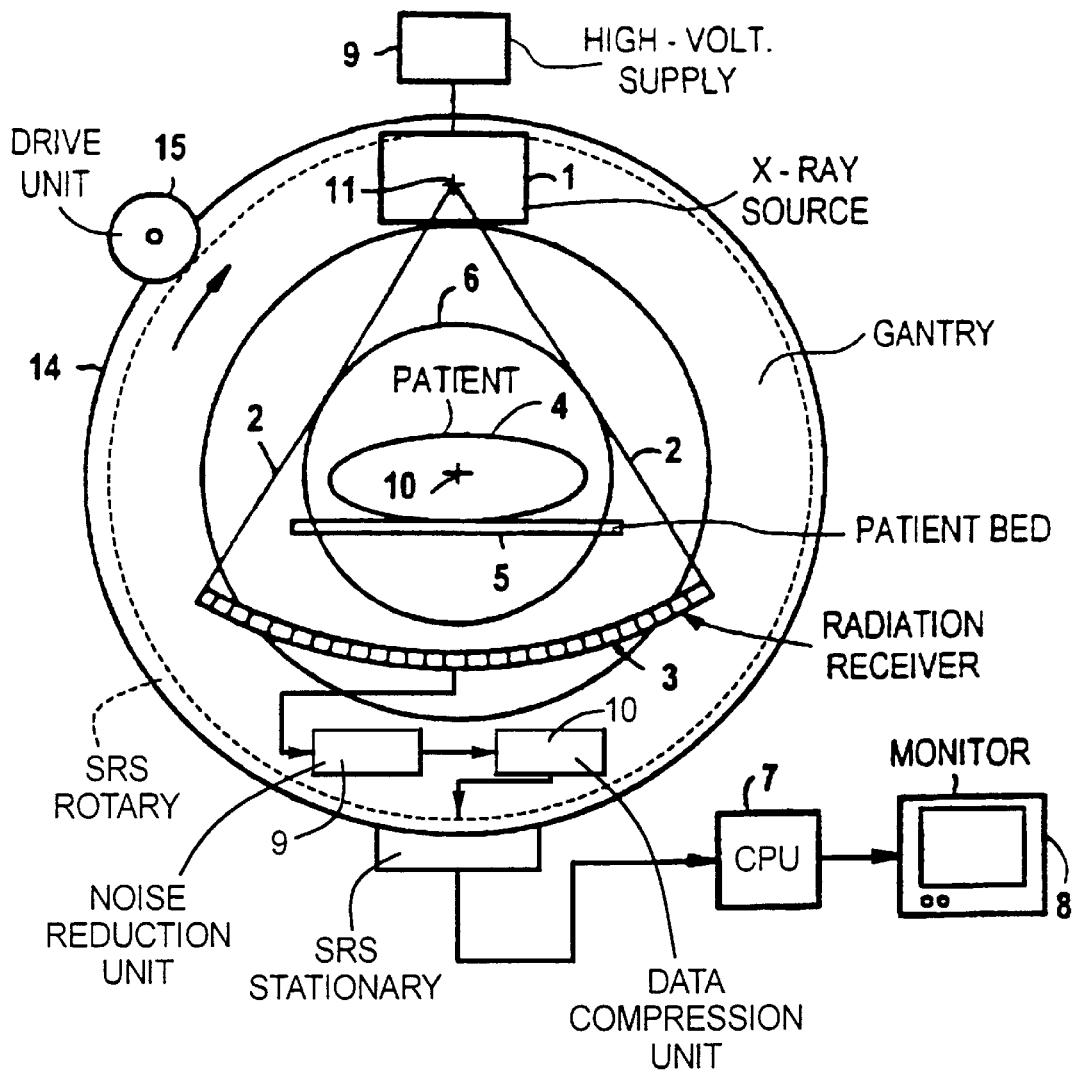

APPARATUS FOR COMPUTER TOMOGRAPHY SCANNING WITH COMPRESSION OF MEASUREMENT DATA

BACKGROUND OF THE INVENTION

1. Field of the Invention

The present invention relates generally to the art of medical diagnostic imaging and in particular to a method and apparatus for a computer tomography of the type wherein the measurement data are compressed en route to the computer that reconstructs images of the scanned object.

2. Description of the Related Art

In computer tomography, raw data is acquired during a scan of an object irradiated by X-rays from an X-ray source from different directions (projections) and the X-rays attenuated by the object are incident on a number of sensors (channels) that are arranged in four rows of a radiation detector. The X-ray source and the detector are mounted on a rotor or gantry. Accordingly, for every rotor position, four vectors of data, ("fan" or "reading") are obtained. During a scan, the rotor is rotated in angular steps, each step giving a new reading. The set of readings for one full turn of the rotor is referred to as "rotation". Either after or during a full rotation, the target is moved in a direction orthogonal to the rotors plane and data accumulated over many rotations are combined into one file that is being preceded by a file header and an additional header for each vector.

In computer tomograph scans having 672 sensors with 4 rows there are 672*4 channels and 2320 readings per rotation. Accordingly, 6236160 measurements per rotation are obtained with each measured value stored as an unsigned word of 16 bit. Thus, there are roughly 12 MByte of data per rotation. The number of rotations depends on the size of the target to be scanned, (for example approximately 10 to 20 rotations are required for scanning a human head). As such, a substantially high array of data is being generated that in turn should be transmitted to a central processing unit for a reconstruction of the scanned object's images.

Therefore, compression methods capable of efficiently compressing these data en route to the computer will improve on the overall operation of CT imaging devices by reducing the storage space and bandwidth required for transmission of the data to the central processing unit.

Generally, in any data compression method for textual data, one deals with a stream of symbols drawn from a known alphabet and attempts to encode the symbols in a manner that storing the encoded symbols take the least possible space. An obvious way to achieve this goal is to assign short codes to symbols that appear frequently in the stream and longer codes to less frequent symbols. For example, Huffman coding is a popular and simple way to implement this strategy.

In codings, the entropy rate of a source is a number that depends only on the statistical nature of the source. In particular, in a First-Order Model where the characters are statistically independent of another the entropy is $h=\Sigma n_i \log_2(p_i)$, with $n_i$ the number of occurrences of symbol i in the data stream and $p_i$ its probability. Based on information theory, the entropy is a lower bound for the number of bits needed to encode a message or a stream of data. However, these probabilities $p_i$ are usually not constant throughout the stream and depend on the context. For example, when compressing German or English texts, the probability for a "u" is very high after a "q". A lot of effort in compression research has been spent on modeling the context, so that a high compression rate can be achieved by context-dependent coding.

One method utilized for data compression is a local prediction based compression. As illustrated by the entropy formula above, the size of the encoded data can be reduced by increasing the probabilities of symbols; (for example, by decreasing their numerical range). Accordingly, by storing differences between data values, one expects to reduce the numerical range of values and to increase the probability of values in the neighborhood of zero. These differences are calculated based on a predicted value. As the input stream is processed, for each data point, a predicted value is calculated based on a data already seen. The difference between this prediction and the actual value is then sent to an entropy encoder.

U.S. Pat. No. 5,592,523 discloses a data compression unit between a rotating gantry and a stationary gantry of a CT scan device. This patent does not disclose a noise reduction technique in conjunction with the compression of data. Furthermore, this patent does not disclose an algorithm for data compression that takes in to account the certain periodicity superimposed to the acquired data in a matrix format. This periodicity occurs because the data is acquired by using four arrays of sensors in one reading.

SUMMARY OF THE INVENTION

It is an object of the present invention to provide a system for compressing data acquired by means of an X-ray source, before the data is being transmitted to a central processing unit. The above object is achieved by utilizing an entropy coding method for data compression in a data compression unit of a computer tomography device.

In one embodiment, the data compression unit is connected to the stationary module of the medical imaging device. The raw data acquired by means of an X-ray source is being stored as a data set in a matrix format with i rows and j columns, i, j being positive integers. A compression algorithm is then performed upon this data matrix by the compression unit. This results in data being compressed before it is sent to the computer. Once received by the computer, a reconstruction of the object scanned is performed based on the compressed data. The reconstructed image is then displayed on a monitor.

In another embodiment, a certain periodicity is being superimposed to the matrix of data. Taking this periodicity into account leads to significant compression improvements. The invention further allows for fast operation (0.2 ms/projection). Furthermore, a simple code hardware implementation is possible. In addition, only four projections have to be kept in memory during compression/decompression with no need to transfer auxiliary tables from the compressor to a decompressor.

BRIEF DESCRIPTION OF THE DRAWING

The single FIGURE is a schematic illustration of a computer tomography apparatus constructed and operated according to the present invention.

DETAILED DESCRIPTION OF THE PREFERRED EMBODIMENTS

The basic components of a CT system operating according to the present invention are depicted in the figure. The computer tomography system has an x-ray source 1 and a radiation receiver detector 3 that are mounted on a rotatable gantry 14. The X-ray source 1 is operated by a high voltage supply 9 to emit a fan shaped X-ray beam 2 from a focus 11. The gantry 14 is rotated in the direction of the arrow by a drive unit 15 so that a patient 4 disposed in an examination volume 6 and lying on a patient bed 5, is irradiated by the X-ray beam 2 from a number of different projections. For each projection measurement data are produced by the radiation receiver 3 dependant on the attenuated X-rays incident thereon. In the plane of the drawing shown in the figure, the radiation receiver is shown as being composed of a row of detector elements, however, the X-ray beam and the radiation receiver 3, will have an extent perpendicular to the plane of the drawing such that the receiver 3 will be composed of a number of adjacent detector rows, such as four rows (four channels). Measurement data from the radiation receiver 3 are supplied to a noise reduction unit 9 and then to a data compression unit 10. The compressed data are supplied to a slip ring system composed of a rotary module SRS rotary and a stationary module SRS stationary. The data are supplied to a central processing unit 7 for image reconstruction of the scanned object, which is displayed on a monitor 8.

In later generation CT devices, the focus 11 is caused to rotate around the patient 4, without necessarily rotating the X-ray source itself.

The following discussion assumes that data are stored in a 2-dimensional array. Each row of this matrix contains a data vector read from the 672 sensors. Four rows correspond to one reading and the next four rows belong to the next step of rotor rotation. (If one ignores information headers, this is the format in which raw data are stored in the files to be compressed.) Processing of these data is done row by row, scanning each row left to right. For convenience of discussion, the data elements in the vicinity of a position (i, j) being processed are named such that the position (ij) (and also its contents) is referred to as X, and (i, j−1) is referred to as A. Other positions are referred to as shown in the table:

|   |   | C | B | D |
|---|---|---|---|---|
| E | A | X |   |   |

Values A through E all have been seen when X is processed and are also available in the decompression process when X is reconstructed. Here, values in the "future" of X are not used as they are not available for decompression.

Using data values in the neighborhood of X is a well known concept. The JPEG standard defines the following prediction modes and formulas for lossless compression:

| Mode | Prediction |
|------|------------|
| 0 | 0 |
| 1 | A |
| 2 | B |
| 3 | C |
| 4 | A + B − C |
| 5 | A + (B − C)/2 |
| 6 | B + (A − C)/2 |
| 7 | (A + B)/2 |

In addition, tests were performed with the following formulas:

| Mode | Prediction |
|------|------------|
| 8 | (3*(A +) − 2*C)/4 |
| 9 | A + D − B |
| 10 | A + (D − B)/2 |
| 11 | median (A, B, A + B − C) |

The results indicated that modes 7 and 11 yield the best results.

Furthermore, predictions are deteriorated by noise in measured data. Prediction improvements are achieved by first applying a noise reduction technique in the data-reduction unit to the data in the previous row before it is used for predictions. To this purpose, each data value $x_i$ in the preceding row of the matrix is replaced by the median of $x_{i-1}$, $x_i$, and $x_{i+1}$.

Also, due to the way the data are created (using four arrays of sensors in one reading) there is a certain periodicity superimposed to the matrix of data. This is easy to see if data is being "visualized". For this purpose, a color value can be assigned to each possible data value. By using these colors, the data can be transformed for one set of readings into a ppm-file. By observing typical images made this way it is apparent that the row i−4 in the matrix is more similar to row i than to row i−1. Thus, in the prediction formulas above, the values C, B, and D should be taken not from the previous row, but from the fourth predecessor. This further results in significant compression improvements.

In addition, there is a systematic horizontal misalignment between adjacent rows in a typical image that varies between different areas. Accordingly, shifting the two rows of the matrix being considered in prediction calculations is a way to improve prediction and thus compression. This provides a slight improvement. The trade off in this approach is that each row is being processed multiple times in order to find the optimum offset resulting in a significant increase in compression time.

Data values delivered by the tomograph can also be interpreted as points in a three-dimensional space with the x-axis corresponding to the sensor vector, the y-axis to the rotor angles, and the z-axis to the horizontal stepping of the target object yield. Yet, test results indicated that utilizing the x-y-plane preceding in the z-direction to calculate predictions yield significantly inferior results as compared to only utilizing the x-y plane. Another disadvantage in using the z-direction is storing all the data of the x-y-plane for predictions in the next plane. On the other hand, to calculate predictions utilizing the x-y-plane, one is not required to store the whole matrix and keeping the last four rows in memory is sufficient.

Upon calculation of the prediction values and as part of the compression process, the differences between predicted and actual data values are sent to an entropy encoder within the compression unit.

Test runs that form the basis of the present invention are performed based on various coding processes including, Huffman Coding, Arithmetic Coding, Golomb-Rice coding, Run length Coding. The results indicate that good compression at high speed can be achieved by using Golomb-Rice coding, as known from the newer standard of lossless JPEG still image compression. These test runs are based on Input data from a head screen and a lung screen that are approximately equally distributed in the interval of 0 through 12000.

As such, the entropy of 6236160 symbols (672 sensors× 4rows×2320 readings) is 7867382 Bytes or 10.1 bit/symbol.

This corresponds to a possible compression factor of 10.1/16=62.1%. By applying the local prediction based comparison, as previously discussed, the range of the input data reduces to −1700 through 1500, with data being unevenly distributed in this interval. Thus, the entropy goes down to 5471959 Bytes, corresponding to 7.0 bits/symbol and a compression factor of 43.9%. The following text describes the various coding methods.

Huffman Coding

In Huffman coding, codes are assigned to symbols in a way that the total code length is minimized, provided that each symbol is encoded with a discrete number of bits. If a symbol appears very frequently in the data stream, its entropy can drop below 1 bit/symbol, yet, in Huffman coding at least one full bit for encoding is required. Thus, in general, the length of a Huffman-encoded data stream will be larger than its entropy. Furthermore, in this method, the code tables need to be transported in order to be used by the decoder, which also take some space. For the example discussed above, Huffman coding results in 5491423 Bytes of encoded data plus 10557 Bytes for code tables. Thus, the overall compression rate is 44.1%, slightly more than the 43.9% calculated from the entropy.

Arithmetic Coding

In Arithmetic coding, there is no one-to-one correspondence between symbols and codes. Instead, the whole data stream is mapped to a (conceptually) floating point number representing the probability of the whole data stream. The bits representing this number are emitted sequentially during the coding process and allow the reconstruction of the original data stream. Theoretically, by overcoming the discrete number of bits/symbol barrier, compression rates corresponding to the entropy can be achieved. However, practically, due to limited word size of computers, probabilities of symbols have to be scaled and distorted, resulting in a deterioration of compression rates. For our example, the initial entropy of 5471959 Bytes is increased by the scaling process to 5560772 Bytes and we have to transport a code table of 12906 Bytes, so that the overall compression rate becomes 44.7% that is less desirable than the result of Huffman coding.

Golomb-Rice Coding

In Golomb-Rice coding, a positive number x to be encoded is broken into two parts, depending on a parameter k. The first part contains a unary encoding of x/2k, or x>>k in C-notation; the second part contains the k least significant bits of x. The two parts are separated by a 0-bit, so the end of the unary encoding can be detected. The following table shows the encoding of 25 (binary 11001) for different values of k.

| k | x >> k | code |
|---|--------|------|
| 0 | 25 | 11111111111111111111111111 0 |
| 1 | 12 | 1111111111111 0 1 |
| 2 | 6 | 1111111 0 01 |
| 3 | 3 | 1110 001 |
| 4 | 1 | 1 0 1001 |
| 5 | 0 | 0 11001 |
| 6 | 0 | 0 011001 |
| 7 | 0 | 0 0011001 |

Golomb-Rice codes are optimum when the values x obey an exponentially decaying probability distribution and the parameter k is determined correctly from the mean and variance of the distribution. A good approximation for k is given by the formula $k=\log_2 A/N$ where A is the sum of values x seen so far and N the number of these values. (In the test run application x is derived from the prediction error by a mapping that transforms all error values to a non-negative number). The mean of the distribution (approximated by A/N) may vary as one scans over the data. Therefore, one defines different contexts; each context uses an appropriate value of k for encoding. Usually, contexts are determined using the local gradients of the data. However, in the test run application, a much simpler approach was successfully taken namely; the x-y plane is divided into a number of vertical stripes and each stripe defines one context. For each context, to be stored from which the value of k can be determined. The decoding process has to build the same counters, but no tables have to be transported from the encoder to the decoder.

Run Length Encoding

A small further improvement can be achieved by run length encoding for zeros, as zero is the most frequent symbol and often comes in groups. This is implemented by inserting a run length code after each encoded zero-value. For a single zero, this code consists of a single zero-bit. Put differently, there is an initial loss of one bit with a subsequent gain when zeros are repeated. For a sequence of n zeros, the code consists of a value W, binary encoded in w bits, preceded by a unary representation of w and a single zero-bit to mark the end of the unary bit string, i.e. 2w+1 bits are needed for the run length encoding. The following table shows how many bits are needed to encode a run of zeros in this way. In this table z is the number of bits needed to encode the first zero in the run.

| run length | W | w | length of run length code | length/zero [bit] |
|---|---|---|---|---|
| 1 |   | 0 | 1 | z + 1 |
| 2 | 0 | 1 | 3 | z/2 + 1.5 |
| 3 | 1 | 1 | 3 | z/3 + 1 |
| 4 | 0 | 2 | 5 | z/4 + 1.25 |
| 5 | 1 | 2 | 5 | z/5 + 1 |
| 6 | 2 | 2 | 5 | z/6 + 0.83 |
| 7 | 3 | 2 | 5 | z/7 + 0.71 |

For our example run length encoding reduces the size of encoded data further to 4844596 Bytes, corresponding to a compression rate of 38.8%. The average code length for a zero goes 4.36 to 1.52 bits. Test results for the tests performed based on the above encoding processes are summarized in the following table.

| Input Data: | | |
|---|---|---|
| file | Sehn 1.04 | rotation 4 of Sehn1.dat |
| readings | 2320 | |
| vectors | 9280 | |
| channels | 672 | |
| data | 12472320 | Bytes |

| Compression Results: | | | | | |
|---|---|---|---|---|---|
| Method | Output Size | bits/ symbol | compression rate | CPU time [sec] | code length [LoC] |
| Huffman | 5491423 | 7.06 | 44.1% | 5.77 | 784 |
| Arithmetic | 5574002 | 7.15 | 44.7% | 8.02 | 637 |

-continued

Compression Results:

| Method | Output Size | bits/ symbol | compression rate | CPU time [sec] | code length [LoC] |
|---|---|---|---|---|---|
| LOCO | 4844596 | 6.21 | 38.8% | 6.53 | 341 |
| gzip | 6813630 | 8.74 | 54.6% | 9.09 | |
| bzip2 | 5376753 | 6.90 | 43.1% | 22.02 | |

All compression methods were being applied to the same stream of differences between data values and predictions. Compression rate is defined as (size of compressed data)/(size of original data). In the above table, "LOCO" stands for Golomb-Rice code based "LOw COmplexity LOssless Compression" combined with run length encoding for zeros. Also, gzip is the public domain Lempel-Ziv based compression program and bzip2 is a newer public domain code based on the Burrows-Wheeler transform. All times are given for a Fujitsu-Siemens Lifebook E 6540 with a 600 MHZ Pentium III processor running Linux 2.2.16; for compilations the GNU-compiler g++-2.95.2 was used.

The LOGO approach not only gives best results, but is also attractive when simplicity and size of program code are considered. As no sophisticated data structures are needed, it could also be implemented in hardware.

Although modifications and changes may be suggested by those skilled in the art, it is the intention of the inventor to within the patent warranted hereon all changes and modifications as reasonably and properly come within the scope of his contribution to the art.

We claim:

1. A computer tomography apparatus comprising:

an X-ray source which emits an X-ray beam from a focus, at least said focus being rotatable around an axis;

a radiation detector having four rows of detector elements disposed in successions along said axis and extending substantially transversely to said axis, said X-ray source and said radiation detector being adapted to receive an object therebetween as said focus rotates so that said radiation detector generates measurement data representing X-rays in said beam attenuated by the object, said measurement data being organized as respective entries Xij in a matrix having i rows and j columns;

a data compression unit supplied with said measurement data which compresses said measurement data using a prediction algorithm which produces predicted values, followed by an entropy encoding the predicted values, to produce compressed data, said data compressing unit when executing said prediction algorithm for an entries Xij in row i, using entries X(i–4)j in row (i–4) of said matrix;

an image computer supplied with said compressed data, said image computer decompressing said compressed data to recover said measurement data and producing image data therefrom representing an image of said object; and a display supplied with said image data for visually displaying said image.

2. A computer tomography apparatus according to claim 1, further comprising; a noise reduction unit supplied with said measurement data, said noise reduction unit produces noise-reduced measurement data by performing a noise reduction technique on said measurement data.

3. A computer tomography apparatus according to claim 1, wherein said data compression unit comprises a Golomb-Rice encoder for said entropy encoding.

4. A computer tomography apparatus according to claim 1, wherein said data compression unit comprises a Huffman encoder for said entropy encoding.

5. A computer tomography apparatus according to claim 1, wherein said data compression unit comprises an Arithmetic encoder for said entropy encoding.

6. A computer tomography apparatus according to claim 1, wherein said data compression unit comprises an Run length encoder for said entropy encoding.

7. A computer tomography apparatus comprising:

an X-ray source which emits an X-ray beam from a focus, at least said focus being rotatable around an axis;

a radiation detector, said radiation detector and said X-ray source being adapted to receive an object therebetween as said focus rotates so that said radiation detector generates measurement data representing X-rays in said beam attenuated by the object, said measurement data being organized as respective entries Xij in a matrix having i rows and j columns;

a noise reduction unit supplied with said measurement data which performs a noise reduction technique on said measurement data to produce noise-reduced measurement data;

a data compression unit supplied with said noise-reduced data which compresses said noise-reduced data by executing a prediction algorithm on said noise-reduced data to produce predicted values, followed by entropy encoding the predicted values thereby producing compressed data, said data compressing unit when executing said prediction algorithm for an entries Xij in row i, using entries X(i–4)j in row (i–4) of said matrix;

an image computer supplied with said compressed data, said image computer decompressing said compressed data to recover said measurement data and producing image data therefrom representing an image of said object; and a display supplied with said image data for visually displaying said image.

8. A computer tomography apparatus according to claim 7, wherein; the noise reduction technique is being executed for the entries Xij using a median of entries X(i–1), Xi, X(i+1) in a preceding row instead of entries Xi in the preceding row; and a Golomb-Rice coding method is utilized for entropy encoding of the predicted values.

9. A computer tomography apparatus according to claim 7, wherein said data compression unit comprises a Golomb-Rice encoder for said entropy encoding.

10. A computer tomography apparatus according to claim 7, wherein said data compression unit comprises a Huffman encoder for said entropy encoding.

11. A computer tomography apparatus according to claim 7, wherein said data compression unit comprises an Arithmetic encoder for said entropy encoding.

12. A computer tomography apparatus according to claim 7, wherein said data compression unit comprises an Run length encoder for said entropy encoding.

* * * * *